United States Patent
Mizuta et al.

(10) Patent No.: US 7,672,395 B2
(45) Date of Patent: Mar. 2, 2010

(54) DIGITAL PREDISTORTER AND PREDISTORTION METHOD THEREFOR

(75) Inventors: Shinji Mizuta, Yokohama (JP);
Yasunori Suzuki, Yokohama (JP);
Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 903 days.

(21) Appl. No.: 11/247,267

(22) Filed: Oct. 12, 2005

(65) Prior Publication Data

US 2006/0088124 A1    Apr. 27, 2006

(30) Foreign Application Priority Data

Oct. 27, 2004    (JP)    .............................. 2004-312620

(51) Int. Cl.
*H04L 25/49*    (2006.01)
(52) U.S. Cl. ....................... 375/296; 375/254; 375/295; 375/297; 375/299; 375/354; 330/52; 330/149
(58) Field of Classification Search ................. 375/135, 375/136, 145, 147, 150, 220, 252, 254, 255, 375/260, 267, 295–297, 299, 354, 359; 330/52, 330/149, 50, 150
See application file for complete search history.

(56) References Cited

U.S. PATENT DOCUMENTS

| | | | | |
|---|---|---|---|---|
| 6,108,385 | A * | 8/2000 | Worley, III | .................... 375/296 |
| 7,170,342 | B2 * | 1/2007 | Suzuki et al. | ................ 330/149 |
| 7,366,252 | B2 * | 4/2008 | Cova et al. | ................... 375/296 |

(Continued)

FOREIGN PATENT DOCUMENTS

EP    1 463 198 A2    9/2004

(Continued)

OTHER PUBLICATIONS

U.S. Appl. No. 11/444,494, filed Jun. 1, 2006, Suzuki et al.

(Continued)

*Primary Examiner*—Shuwang Liu
*Assistant Examiner*—Hirdepal Singh
(74) *Attorney, Agent, or Firm*—Oblon, Spivak, McClelland, Maier & Neustadt, L.L.P.

(57) ABSTRACT

A predistorter includes: a divider that divides an input signal and supplies the divided input signal to a linear transmission path and a distortion generating path; a (2k−1)th-order distortion generator that raises the signal supplied to the distortion generating path to the (2k−1)th power to generate a distortion component; a vector adjuster that adjusts the amplitude and phase of the output of the (2k−1)th-order distortion generator; and an adder that sums up the output of the vector adjuster and the output of the linear transmission path to generate a predistorted signal r(t), in which the (2k−1)th-order distortion generator comprises: a (2k−1)th-order multiplier (27B4) that raises the divided signal to the (2k−1)th power; a lower-than-(2k−1)th-order multiplier (27B3, 27B2, 27B1) that raises the divided signal to the 5th, 3rd and 1st power, respectively; a vector adjuster (27C3, 27C2, 27C1) that adjusts the amplitude and phase of the output of the lower-than-(2k−1)th-order multiplier; and an adder (27D) that sums up the output of the vector adjuster and the output of the (2k−1)th-order multiplier.

6 Claims, 8 Drawing Sheets

FIRST EMBODIMENT

U.S. PATENT DOCUMENTS

| | | | |
|---|---|---|---|
| 7,551,686 B1* | 6/2009 | Coons et al. | 375/296 |
| 2004/0189378 A1* | 9/2004 | Suzuki et al. | 330/52 |
| 2005/0141637 A1* | 6/2005 | Domokos | 375/296 |
| 2005/0157814 A1* | 7/2005 | Cova et al. | 375/297 |
| 2006/0061418 A1* | 3/2006 | Matsuura et al. | 330/149 |

FOREIGN PATENT DOCUMENTS

| | | |
|---|---|---|
| GB | 2 335 813 A | 9/1999 |
| JP | 11-289227 | 10/1999 |
| JP | 2002-506307 | 2/2002 |
| JP | 2003-229727 | 8/2003 |
| JP | 2004-112151 | 4/2004 |

OTHER PUBLICATIONS

U.S. Appl. No. 11/446,381, filed Jun. 5, 2006, Suzuki et al.

Toshio Nojima, et al., "Cuber Predistortion Linearizer for Relay Equipment in 800 MHz Band Land Mobile Telephone System", IEEE Transactions on Vehicular Technology, vol. VT-34, No. 4, Nov. 1985, pp. 169-177.

Shinji Mizuta, et al., "Digital Predistortion Linearizer for Compensating Frequency-Dependent IM Distortion," $34^{TH}$ European Microwave Conference, 2004, pp. 1053-1056.

* cited by examiner

FIG. 3A
INPUT SIGNAL TO PREDISTORTER

FIG. 3B
OUTPUT SIGNAL FROM LINEAR TRANSMISSION PATH

FIG. 3C
OUTPUT SIGNAL FROM THIRD-ORDER DISTORTION GENERATING PATH

FIG. 3D
PREDISTORTER OUTPUT

SPECTRUM OF SIGNAL OUTPUT FROM
FIFTH-ORDER DISTORTION GENERATING PATH

FIG. 4

FIG. 5A
OUTPUT SIGNAL FROM THIRD-ORDER
DISTORTION GENERATING PATH
ACCORDING TO CONVENTIONAL METHOD

FIG. 5B
OUTPUT SIGNAL FROM THIRD-ORDER
DISTORTION GENERATING PATH
ACCORDING TO PRESENT INVENTION

FIG. 6 FIRST EMBODIMENT

FIG. 7 THIRD-ORDER DISTORTION GENERATOR ACCORDING TO FIRST EMBODIMENT

FIG. 8 FIFTH-ORDER DISTORTION GENERATOR ACCORDING TO FIRST EMBODIMENT

FIG. 9 SEVENTH-ORDER DISTORTION GENERATOR ACCORDING TO FIRST EMBODIMENT

DIGITAL PREDISTORTER AND PREDISTORTION METHOD THEREFOR

BACKGROUND OF THE INVENTION

1. Field of the Invention

The present invention relates to a predistorter for linearizing a power amplifier for a radio communication transmitter and a predistortion method therefor.

2. Description of the Related Art

Microwave power amplifiers used in base stations or terminals of cellular phone systems require high power efficiency for achieving lower power consumption and compactness. In general, the efficiency of a power amplifier increases as its operating point approaches the saturation output power, and thus, it is desirable that the power amplifier operates in a region close to the saturation output power. However, the power amplifier operating in the region close to the saturation power generates a high level of distortion component. In a base station or a terminal, the power amplifier has to achieve a predetermined attenuation level of a distortion component outside the transmitted signal bandwidth (a predetermined adjacent channel power ratio, for example). Therefore, in order to operate the power amplifier in the region close to the saturation power, the distortion component has to be reduced. In order to reduce the distortion component, researches have been made on nonlinear distortion compensation methods for a distortion generated by the power amplifier.

As a distortion compensation method for a power amplifier, there has been proposed a predistortion method. A predistorter adds a signal to an input signal in advance to cancel a distortion component generated in a power amplifier. The added signal is equal in level and opposite in phase to the distortion component generated in the power amplifier. The amount of distortion compensation by the predistortion method depends on the amplitude and phase error between the added signal and the distortion component. For example, in the case where the input/output characteristics of the power amplifier is represented by a power series model, in order to achieve a distortion compensation of more than 30 dB, the amplitude error and phase error between the signal added by the predistorter and the distortion component generated in the power amplifier have to be suppressed within a range of ±0.28 dB and within a range of ±1.8 degrees, respectively.

Figure 1:
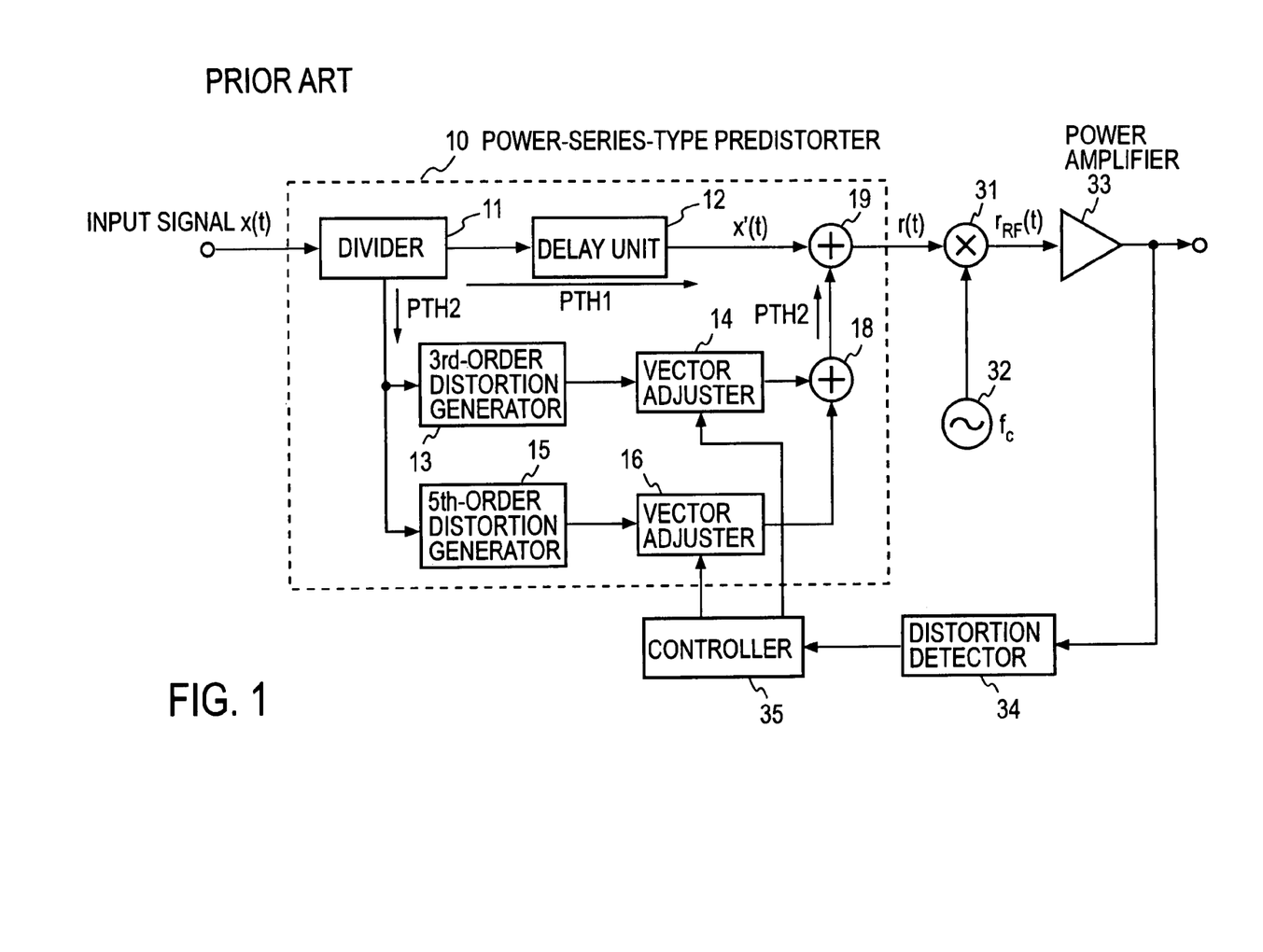
FIG. 1 shows a configuration of a conventional predistorter.

FIG. 1 shows a typical configuration of a conventional predistorter based on complex power series representation. In this example, a predistorter 10 predistorts a baseband input signal x(t), the resulting signal r(t) is mixed with a carrier of a frequency $f_c$ generated by a carrier generator 32 to produce a radio-frequency-band signal $r_{RF}(t)$, and the radio-frequency-band signal $r_{RF}(t)$ is amplified by a power amplifier 33 for transmission.

The signal x(t) input to the predistorter 10 is divided by a divider 11 and the divided signals are provided to a linear transmission path PTH1 and a distortion generating path PTH2. In the distortion generating path PTH2, a third-order distortion generator 13 and a fifth-order distortion generator 15 generate a third-order distortion signal and a fifth-order distortion signal from the divided input signal x(t), respectively. The vectors of these signals are adjusted by vector adjusters 14 and 16, respectively, and summed up by an adder 18.

On the other hand, the input signal provided to the linear transmission path PTH1 is adjusted in delay time by a delay unit 12. The output from the linear transmission path PTH1 and the output from the distortion generating path PTH2 (that is, the output of the adder 18) are summed up by an adder 19 to produce a predistorted signal, which is output as an output r(t) of the predistorter 10. A distortion detector 34 demodulates the radio-frequency output signal from the power amplifier 33 into a base band signal or intermediate frequency band signal and detects a third-order distortion component and a fifth-order distortion component in the signal. The third-order distortion signal and the fifth-order distortion signal generated by the third-order distortion generator 13 and the fifth-order distortion generator 15 are adjusted by the vector adjusters 14 and 16, respectively, so as to cancel the third-order distortion component and the fifth-order distortion component generated in the power amplifier 33 under the control of a controller 35.

In FIG. 1, in general, the distortion generating path PTH2 comprises a third-order distortion generating path made up of the third-order distortion generator 13 and the vector adjuster 14, a fifth-order distortion generating path made up of the fifth-order distortion generator 15 and the vector adjuster 16 and a (2k−1)th-order distortion generating path made up of a (2k−1)th-order distortion generator and an associated vector adjuster, for example. Here, k denotes an integer equal to or greater than 2.

Figure 2:
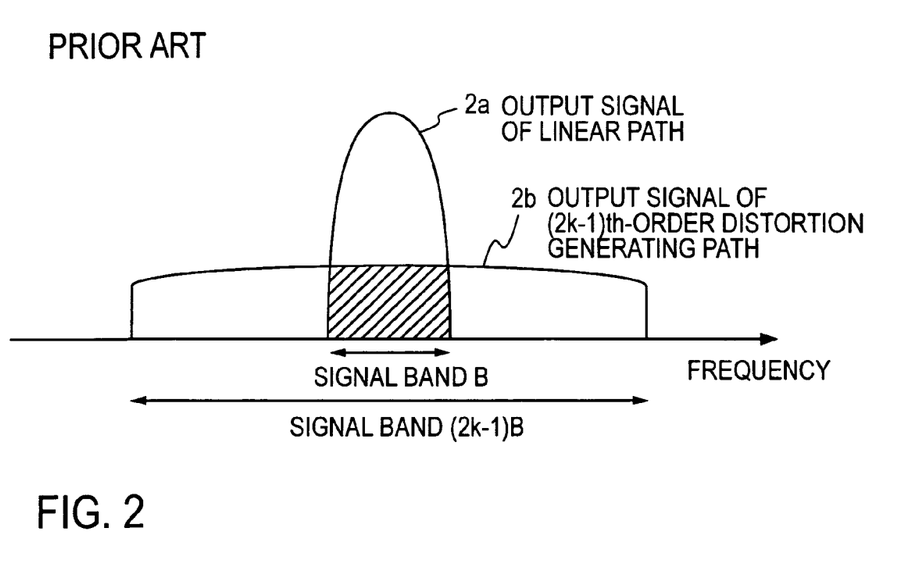
FIG. 2 schematically shows an output spectrum of the conventional predistorter.

The (2k−1)th-order distortion generator in the (2k−1)th-order distortion generating path outputs a signal $x(t)^{(2k-1)}$, which is the input signal x(t) to the predistorter 10 raised to the (2k−1)th power (referred to as (2k−1)th order signal, hereinafter). The output signal of the (2k−1)th-order distortion generator has a bandwidth (2k−1) times wider than a bandwidth of the input signal x(t). As shown in FIG. 2, the band of an output signal 2b of the (2k−1)th-order distortion generating path overlaps with the band of an output signal 2a of the linear transmission path PTH1 (shown by the shaded area in FIG. 2). Here, B represent the bandwidth of the input signal. Thus, the output signal of the distortion generating path interferes with the output signal of the linear transmission path. However, if the output signal of the distortion generating path is sufficiently smaller than the output signal of the linear transmission path, the interference can be ignored. However, when the power amplifier operates in the region close to the saturation power to achieve high efficiency, the distortion component increases. Accordingly, the power of the output signal of the distortion generating path has to be increased. Therefore, the interference of the output signal of the distortion generating path with the output signal of the linear transmission path cannot be ignored.

As an example, in the following, there will be described a case where the input signal x(t) to the predistorter 10 is composed of two carriers of equal amplitude. The output r(t) of the predistorter is expressed by the following equation (see the non-patent reference 1):

$$r(t) = \sum_{k=1}^{n} a_{2k-1}|x(t)|^{2(k-1)}x(t) \quad (1)$$

In this equation, the term $a_1 x(t)$ for k=1 denotes the output signal of the linear transmission path PTH1, and a coefficient $a_1 = \alpha_1$ denotes a linear gain. The term for k≧2 denotes the output signal of the (2k−1)th order distortion generating path. The gain ($\alpha_{2k-1}$) and phase ($\phi_{2k-1}$) of the vector adjuster in the (2k−1)th-order distortion generating path are expressed by the following equation;

$$a_{2k-1} = \alpha_{2k-1} e^{j\phi_{2k-1}} (k \geq 2)$$

where x(t) denotes a complex envelope signal input to the predistorter, and r(t) denotes a complex envelope signal output from the predistorter. In the above, the equation is represented using the complex envelope signals. The RF-band signal $r_{RF}(t)$ to be actually transmitted is expressed by the following equation:

$$r_{RF}(t) = Re\{r(t)\exp(j2\pi f_c t)\} \quad (2)$$

In this equation, Re{ } denotes the real part of a complex variable, and $f_c$ denotes the frequency of a carrier.

Supposing that the frequency interval between the two carriers of equal amplitude is $2f_0$, and the amplitude thereof is A, the complex envelope signal x(t) is expressed by the following equation:

$$x(t) = A\cos(2\pi f_0 t) \quad (3)$$

From the equation (1), the output signal of the linear transmission path of the predistorter is determined to be:

$$\alpha_1 A \cos(2\pi f_0 t)$$

and the output signal of the third-order distortion generating path of the predistorter is determined to be:

$$\frac{3}{4}\alpha_3 A^3 \cos(2\pi f_0 t)e^{j\varphi_3} + \frac{1}{4}\alpha_3 A^3 \cos(3 \cdot 2\pi f_0 t)e^{j\varphi_3}$$

Figure 3A:
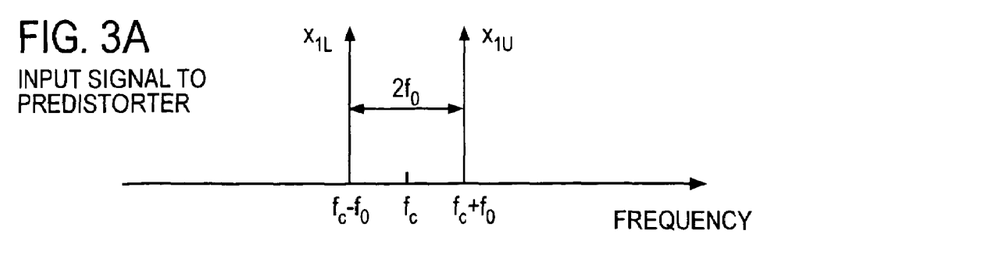
FIG. 3A shows an input signal to the predistorter.
Figure 3B:
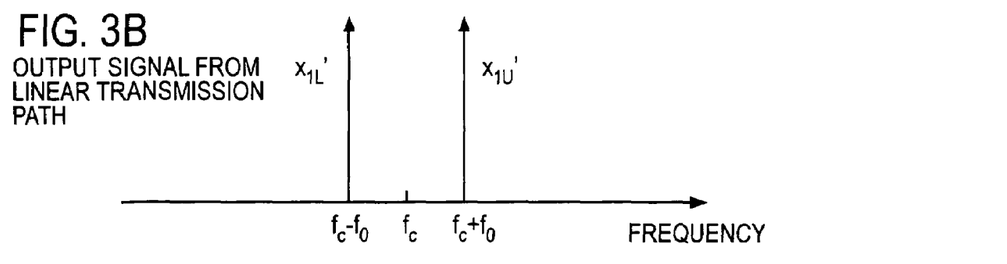
FIG. 3B shows an output signal of a linear transmission path.
Figure 3C:
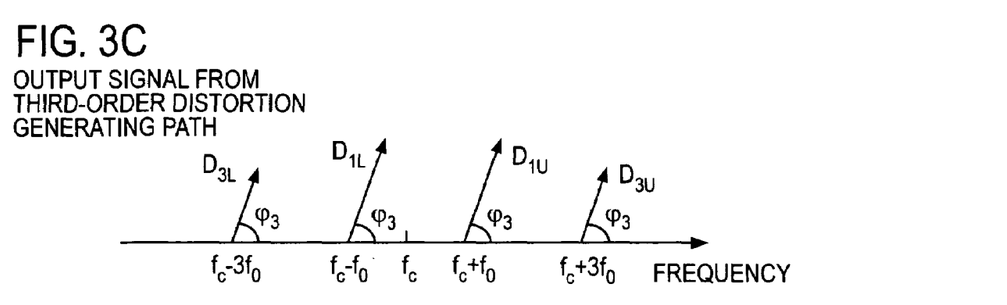
FIG. 3C shows an output signal of a third-order distortion generating path.
Figure 3D:
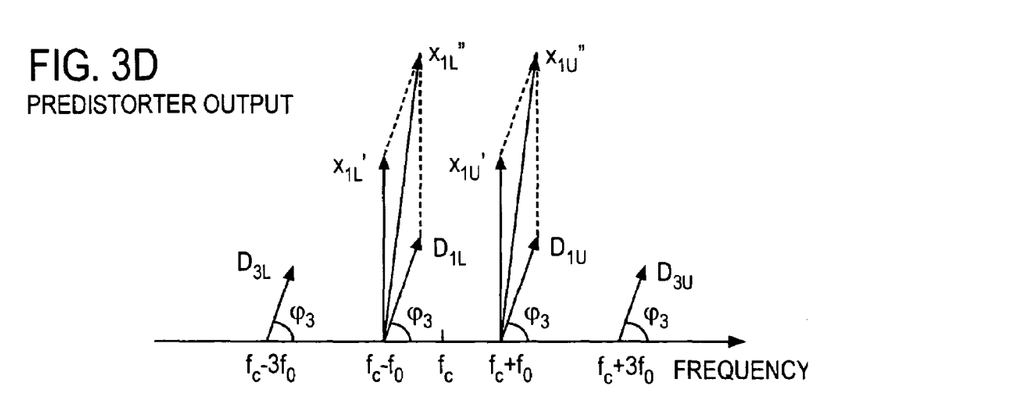
FIG. 3D shows an output signal of the predistorter.

RF band signal components obtained by up-converting the input signal, the output signal of the linear transmission path and the output signal of the third-order distortion generating path with the carrier frequency $f_c$ are shown in FIGS. 3A, 3B and 3C, respectively. In FIGS. 3A to 3D, signals are represented by vectors on a frequency axis. The length and angle of each vector represent the amplitude and phase of the corresponding signal. In FIG. 3A, the input signal is shown as two carrier signals $X_{1L}$ and $X_{1U}$ of equal amplitude. Similarly, in FIG. 3B, the output signal x'(t) of the linear transmission path PTH1 is shown as two carrier signals $X_{1L}'$ and $X_{1U}'$ of equal amplitude. In FIG. 3C, the output signal of the third-order distortion generating path is shown as first-order signal components $D_{1L}$ and $D_{1U}$ and third-order signal components $D_{3L}$ and $D_{3U}$. FIG. 3D shows that sum of the signal components in FIG. 3B and the signal components in FIG. 3C. A signal component $X_{1L}''$ represents the vector synthesis of the signal components $X_{1L}'$ and $D_{1L}$. A signal $X_{1U}''$ components represents the vector sum of the signal components $X_{1U}'$ and $D_{1U}$. The predistorter output r(t), which is made up of sum of the signals from the two paths in the base band by the adder, is expressed by the following equation.

$$r(t) = \quad (4)$$
$$\alpha_1 A\cos(2\pi f_0 t) + \frac{3}{4}\alpha_3 A^3 \cos(2\pi f_0 t)e^{j\varphi_3} + \frac{1}{4}\alpha_3 A^3 \cos(3 \cdot 2\pi f_0 t)e^{j\varphi_3}$$

Up-converting this signal with the carrier frequency $f_c$ results in an RF band signal shown in FIG. 3D. As shown in FIG. 3C, the output signal of the third-order distortion generating path contains the signal components $D_{1L}$ and $D_{1U}$ at frequencies $f_c-f_0$ and $f_c+f_0$, respectively. Due to these signal components, the amplitude and phase of the output signal of the linear transmission path shown in FIG. 3B vary as shown in FIG. 3D. When the power amplifier operates around the saturation region, the variation becomes significant because the level of the output signal of the third-order distortion generating path increases. If such a signal is input to the power amplifier, the amplitude and phase of the distortion component generated in the power amplifier also vary because of the variation of the amplitude and phase of the transmission signal. As a result, to cancel the distortion component generated in the power amplifier, the gain ($\alpha_3$) and phase ($\phi_3$) of the vector adjuster in the third-order distortion generating path have to be readjusted considering the above variation. However, such readjustment causes variation of the amplitude and phase of the transmission signal r(t), which causes variation of the amplitude and phase of the generated distortion component. In this way, since the adjustment of the vector adjuster affects not only the output signal of the third-order distortion generating path but also the generated distortion component, adjustment of the vector adjuster becomes complicated.

Figure 4:
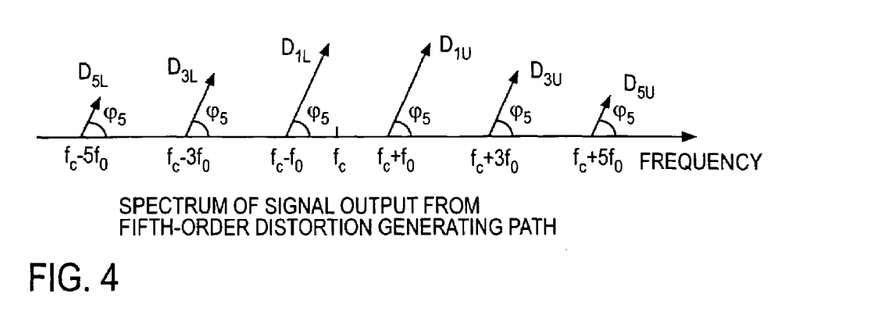
FIG. 4 shows an output signal of a fifth-order distortion generating path in the case where two carriers of equal amplitude are input to the predistorter.

In the above, only the interference of the output signal of the third-order distortion generating path with the output signal of the linear transmission path has been described. In the case of the output signal of the fifth-order distortion generating path shown in FIG. 4, signal components $D_{1L}$, $D_{1U}$, $D_{3L}$, $D_{3U}$, $D_{5L}$ and $D_{5U}$ appear at frequencies $f_c-f_0$, $f_c+f_0$, $f_c-3f_0$, $f_c+3f_0$, $f_c-5f_0$ and $f_c+5f_0$, respectively. Therefore, the output signal of the fifth-order distortion generating path interferes not only with the output signal of the linear transmission path but also with the output signal of the third-order distortion generating path.

As can be seen from the above description, the conventional predistorter has a problem that the output signal of the (2k−1)th-order distortion generating path has components that interfere with the output signal of the linear transmission path and the output signals of lower-than-(2k−1)th-order distortion generating paths. While two carriers of equal amplitude have been described as an example, which have discrete spectrum, the same holds true for a signal with continuous spectrum. To solve the problem described above, in the (2k−1)th-order distortion generating path, it is necessary to reduce the components that interfere with the output signal of the linear transmission path and the output signals of lower-than-(2k−1)th-order distortion generating paths.

Non-patent reference: T. Nojima and T. Konno, "Cuber Predistortion Linearizer for Relay Equipment in 800 MHz Band Land Mobile Telephone System", IEEE Trans. on Vehicular Tech., Vol., VT-34, No. 4, pp. 169-177, November, 1985.

SUMMARY OF THE INVENTION

An object of the present invention is to provide a predistorter that has a distortion generator capable of generating a (2k−1)th-order signal with a lower-than-(2k−1)th-order signal and a linear signal suppressed in a (2k−1)th-order distortion generating path, and a predistortion method therefor.

According to the present invention, there is provided a predistorter, comprising:

a divider that divides an input signal and supplies the divided input signals to a linear transmission path and a distortion generating path, respectively;

a (2k−1)th-order distortion generator that raises the divided input signal supplied to the distortion generating path to the (2k−1)th power to generate a distortion component, where k denotes an integer equal to or greater than 2;

a vector adjuster that adjusts the amplitude and phase of the output signal of the (2k−1)th-order distortion generator; and a adder that sums the output signal of the vector adjuster and the output signal of the linear transmission path and outputs the predistorted input signal, in which the (2k−1)th-order distortion generator has:

a (2k−1)th-order multiplier that raises the divided input signal supplied to the distortion generating path to the (2k−1)th power;

a (2J−1)th-order multiplier that raises the divided input signal to the (2J−1)th power, where J denotes an integer falling within a range of k>J≧1;

a first vector adjuster that adjusts the amplitude and phase of the output of the (2J−1)th-order multiplier; and a first adder that sums up the output of the first vector adjuster and the output of the (2k−1)th-order multiplier and outputs the sum result as an output of the (2k−1)th-order distortion generator, and the first vector adjuster adjusts the amplitude and phase so as to suppress a lower-than-(2k−1)th-order component in the output of the first adder.

According to the present invention, there is provided a predistortion method, comprising:

a step of dividing an input signal and supplying the divided input signals to a linear transmission path and a distortion generating path, respectively;

a step of generating a distortion component by raising the divided input signal supplied to the distortion generating path to the (2k−1)th power, where k denotes an integer equal to or greater than 2; and a step of adjusting the amplitude and phase of the distortion component and adding the adjusted distortion component to the output signal of the linear transmission path, thereby predistorting the input signal, wherein the step of generating a distortion component further comprises:

a sub-step of raising the divided input signal supplied to the distortion generating path to the (2k−1)th power;

a sub-step of raising the divided input signal to the (2J−1)th power, where J denotes an integer falling within a range of k>J≧1; and a sub-step of suppressing a lower-than-(2k−1)th-order component in the result of the raising to the (2k−1)th power using the result of the raising to the (2J−1)th power, thereby generating the distortion component.

According to the present invention, since the lower-than-(2k−1)th-order components in the output of the (2k−1)th-order multiplier in the (2k−1)th-order distortion generator are suppressed, adjustments conducted by the vector adjusters of the predistorter are simplified.

DETAILED DESCRIPTION OF THE PREFERRED EMBODIMENT(S)

(Principal)

According to prior art, supposing that i=(2k−1), an ith-order distortion generator in an ith-order distortion generating path performs the following calculation:

$$d_i(t) = |x(t)|^{2(k-1)}x(t) \tag{5}$$

where x(t) denotes a complex envelope signal input to the ith-order distortion generator, and $d_i(t)$ denotes a complex envelope signal output from the ith-order distortion generator. According to the present invention, the ith-order distortion generator performs the following calculation:

$$d_i(t) = |x(t)|^{2(k-1)}x(t) - \sum_{m=1}^{2k-3} b_{i2m-1}|x(t)|^{2(m-1)}x(t) \tag{6}$$

where $b_{i2m-1}$ denotes a real number. The second term in the right-hand side of the equation (6) represents a signal component of lower than ith order. According to the present invention, the signal components lower than ith order in the second term of the equation (6) are subtracted from the signal components lower than ith order in the first term, thereby suppressing the signal components lower than ith order.

For example, when the input signal is composed of two carriers of equal amplitude a third-order distortion generating path (i=3) will be described as follows. Substituting i=2k−1=3 into the equation (6) results in the following equation:

$$d_3(t) = |x(t)|^2 x(t) - b_{31}x(t) \tag{7}$$

$$= \frac{3}{4}A^3\cos(2\pi f_0 t) + \frac{1}{4}A^3\cos(3 \cdot 2\pi f_0 t) - b_{31}A\cos(2\pi f_0 t)$$

The second term in the right-hand side of the equation (7) represents a third-order distortion component, and the first and third terms represent first-order signal components. Thus, setting the value $b_{31}$ in the equation (7) at $3A^2/4$ results in the following equation:

$$d_3(t) = \frac{1}{4}A^3\cos(3 \cdot 2\pi f_0 t) \tag{8}$$

Figure 5A:
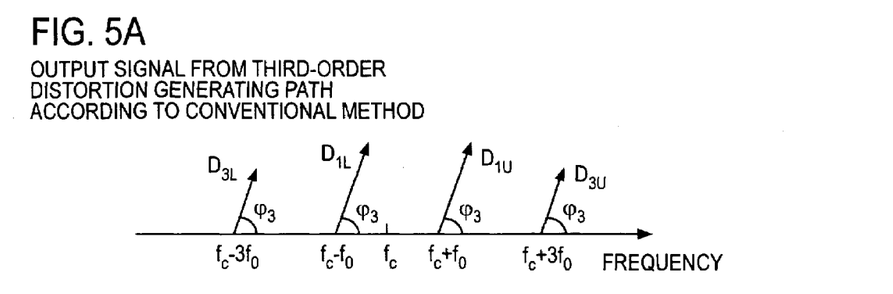
FIG. 5A shows an output signal of the third-order distortion generating path according to a conventional method.
Figure 5B:
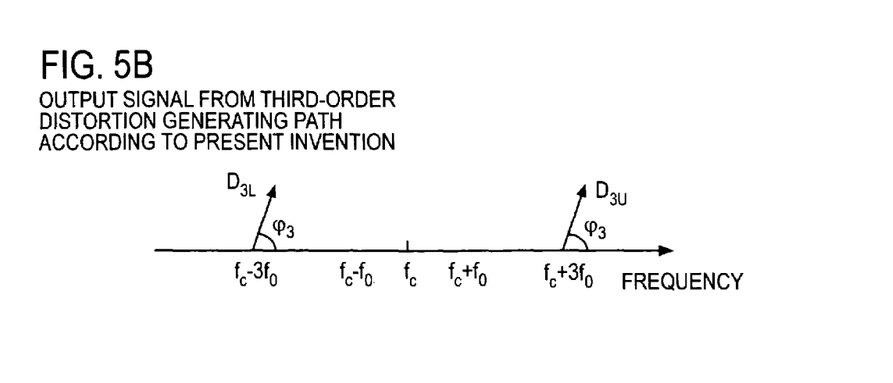
FIG. 5B shows an output signal of a third-order distortion generating path according to the present invention.

Thus, the signal components lower than ith order that interfere with the linear transmission path can be suppressed. An output signal of a third-order distortion generating path according to a conventional method and an output signal of a third-order distortion generating path according to the present invention are shown in FIGS. 5A and 5B, respectively, for comparison. As can be seen from the drawings, according to the conventional method, besides third-order distortion components $D_{3L}$ and $D_{3U}$, first-order signal components $D_{1L}$ and $D_{1U}$ appear. However, according to the present invention, the first-order components $D_{1L}$ and $D_{1U}$ are eliminated.

Similarly, as for a fifth-order distortion generating path when the input signal is composed of two carriers with equal amplitude, substituting i=2k−1=5 into the equation (6) results in the following equation:

$$d_5(t) = |x(t)|^4 x(t) - b_{51}x(t) - b_{53}|x(t)|^2 x(t) \quad (9)$$

$$= \frac{5}{8}A^5\cos(2\pi f_0 t) + \frac{5}{16}A^5\cos(3 \cdot 2\pi f_0 t) +$$

$$\frac{1}{16}A^5\cos(5 \cdot 2\pi f_0 t) - b_{51}A\cos(2\pi f_0 t) -$$

$$b_{53}\left\{\frac{3}{4}A^3\cos(2\pi f_0 t) + \frac{1}{4}A^3\cos(3 \cdot 2\pi f_0 t)\right\}$$

$$= \left\{\frac{5}{8}A^5 - b_{51}A - \frac{3}{4}b_{53}A^3\right\}\cos(2\pi f_0 t) +$$

$$\left\{\frac{5}{16}A^5 - \frac{1}{4}b_{53}A^3\right\}\cos(3 \cdot 2\pi f_0 t) + \frac{1}{16}A^5\cos(5 \cdot 2\pi f_0 t)$$

In order that the third-order signal component and the first-order signal component in the equation (9) are made 0, the values $b_{51}$ and $b_{53}$ can be set so as to satisfy the following simultaneous equations:

$$\frac{5}{8}A^5 - b_{51}A - \frac{3}{4}b_{53}A^3 = 0 \quad (10)$$

$$\frac{5}{16}A^5 - \frac{1}{4}b_{53}A^3 = 0$$

The solutions of the simultaneous equations are as follows:

$$b_{51} = -\frac{5}{16}A^4, \; b_{53} = \frac{5}{4}A^2 \quad (11)$$

Substituting the equation (11) into the equation (9) results in the following equation.

$$d_5(t) = \frac{1}{16}A^5\cos(5 \cdot 2\pi f_0 t) \quad (12)$$

Thus, a fifth-order distortion component $d_5(t)$ free from the first-order signal component and the third-order signal component, which interfere with the linear transmission path and the third-order distortion generating path, respectively, is obtained.

In the above, the third-order distortion generator and the fifth-order distortion generator have been described. In general, a component that interferes with the output of a lower-than-ith-order distortion generating path can be suppressed by optimally determining the values $b_{i1}, b_{i3}, \ldots, b_{ij-2}$ for an ith-order distortion generator (i denotes an odd number equal to or greater than 3).

First Embodiment

Figure 6:
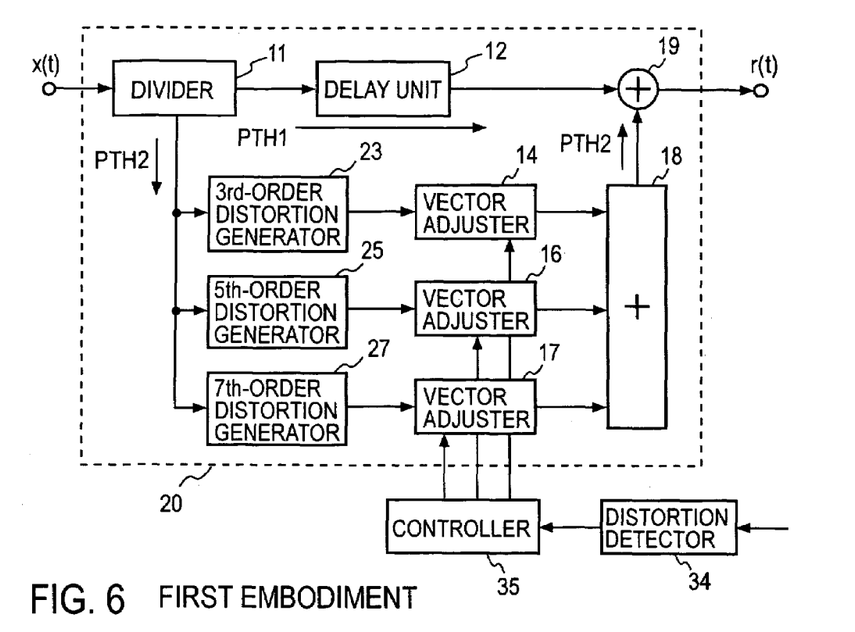
FIG. 6 shows a configuration of a predistorter according to a first embodiment of the present invention.

FIG. 6 shows a predistorter according to a first embodiment of the present invention. A predistorter 20 according to the present invention is basically similar to the conventional predistorter shown in FIG. 1 in that it has a linear transmission path and one or more ith-order distortion generating paths. However, according to the principle of the present invention, the predistorter 20 differs from the conventional predistorter in the configuration of the ith-order distortion generator in each ith-order distortion generating path, as described below.

As shown in FIG. 6, the predistorter 20 according to the first embodiment comprises a divider 11 that divides an input signal and supplies the divided input signals to a linear transmission path PTH1 and a distortion generating path PTH2, a delay unit 12 disposed on the linear transmission path PTH1, a third-order distortion generator 23, a fifth-order distortion generator 25 and a seventh-order distortion generator 27 each of which receives the divided input signal from the distortion generating path PTH2, vector adjusters 14, 16 and 17 which are connected in series to the third-order, fifth-order and seventh-order distortion generators 23, 25 and 27, respectively, an adder 18 that sums up the outputs of the vector adjusters 14, 16 and 17 and outputs the sum result as an output of the distortion generating path PTH2, and an adder 19 that sums up the output of the linear transmission path PTH1 and the output of the distortion generating path PTH2 and outputs the sum result as an predistorted output r(t) of the predistorter 20.

A signal path including the third-order distortion generator 23 and the vector adjuster 14 constitutes a third-order distortion generating path, a signal path including the fifth-order distortion generator 25 and the vector adjuster 16 constitutes a fifth-order distortion generating path, and a signal path including the seventh-order distortion generator 27 and the vector adjuster 17 constitutes a seventh-order distortion generating path. In FIG. 6 illustrating the first embodiment, the distortion generating paths that generate distortions of seventh and lower orders are shown. However, a distortion generating path that generates a higher-than-seventh-order distortion may be provided, only the third-order and fifth-order distortion generating paths may be provided, or only the third-order distortion generating path may be provided. A set of any number of nth-order distortion generating paths may be used (n denotes an odd number equal to or greater than 3), or one nth-order distortion generating path may be used (n denotes an odd number equal to or greater than 3). The delay unit 12 is constituted by a delay memory.

In the embodiment shown in FIG. 6, the third-order distortion generator 23 outputs only a third-order distortion component by removing a first-order distortion component. The fifth-order distortion generator 25 outputs only a fifth-order distortion component by removing a first-order distortion component and a third-order distortion component. Similarly, the seventh-order distortion generator 27 outputs only a seventh-order distortion component. The third-order, fifth-order and seventh-order distortion components are adjusted in vector (phase and amplitude) by the vector adjusters 14, 16 and 17, respectively, and summed up by the adder 18, and the sum result is passed to the adder 19 as an output of the distortion generating path PTH2. The adder 19 sums up the output of the linear transmission path PTH1 and the output of the distortion generating path PTH2 and outputs the sum result in the form of a signal r(t) that is predistorted by the predistorter 20 according to the present invention. As in the conventional example shown in FIG. 1, a distortion detector 34 detects a distortion component in the output of a power amplifier (not shown), and a controller 35 makes the vector adjusters 14, 16 and 17 adjust the vector of the distortion components so that the detected distortion component is reduced to a minimum level.

Figure 7:
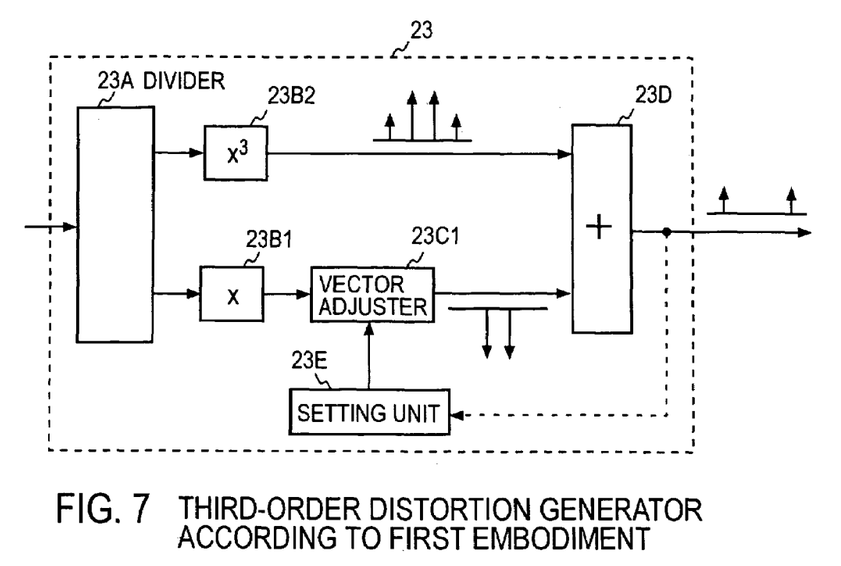
FIG. 7 shows a configuration of a third-order distortion generator according to the first embodiment.

FIG. 7 shows a configuration, based on the principle of the present invention, of the third-order distortion generator 23 according to the first embodiment shown in FIG. 6. The third-order distortion generator 23 carries out the calculation expressed by the equation (7) and comprises a divider 23A that divides the input signal into two paths, a third-order multiplier 23B2 that raises the divided signal to the third power, a first-order multiplier 23B1 that raises the divided signal to the first power, a vector adjuster 23C1 that adjusts the amplitude and phase of the output of the first-order multiplier 23B1, an adder 23D that sums up the output signal of the vector adjuster 23C1 and the output signal of the third-order multiplier 23B2 and outputs the sum result as the third-order distortion component generated by the third-order distortion generator 23, and a setting unit 23E that configures the vector adjuster 23C1 for appropriate adjustment.

The first-order multiplier 23B1 is shown in this drawing only for illustrating the concept of the first-order component of the input signal x(t) represented by the term $-b_{31}x(t)$ or $-b_{31}A\cos(2\pi f_0 t)$ in the equation (7). Thus, in actual, the divided input signal is simply directly passed to the vector adjuster 23C1, and the first-order multiplier 23B1 for carrying out the raising to the first power is not provided as an actual entity. The first-order component is adjusted in phase and amplitude by the vector adjuster 23C1 and then passed to the adder 23D. The setting of the vector adjuster 23C1 is conducted by the setting unit 23E in such a manner that $b_{31}=(3/4)A^2$ in the equation (7) as described above. The value $b_{31}$ can be immediately determined once the amplitude A of the input signal is given.

The third-order multiplier 23B2 raises the divided input signal x(t) to the third power, and the output signal thereof contains a first-order component and a third-order component corresponding to the first term $(3/4)A^3 \cos(2\pi f_0 t)$ and the second term $(1/4)A^3 \cos(3 \times 2\pi f_0 t)$ in the right-hand side of the equation (7), respectively. The output of the third-order multiplier 23B2 and the output of the vector adjuster 23C1 are summed up by the adder 23D. In this way, the first-order component is removed, and only the third-order distortion component is ideally output.

As described above, in the third-order distortion generator 23 according to the first embodiment, the input signal is raised to the third power, and the vector adjuster 23C1 determines the amplitude and phase of the first-order component of the input signal so as to eliminate the first-order component. Therefore, in the embodiment shown in FIG. 7, the output signal of the third-order distortion generator 23 does not contain a fundamental wave component, which is a first-order component. Therefore, the adjustment of the amplitude and phase of the output signal of the third-order distortion generator by the vector adjuster 14 in the third-order distortion generating path shown in FIG. 6 has no effect on the amplitude and phase of the fundamental wave component in the output signal r(t) of the adder 19.

Figure 8:
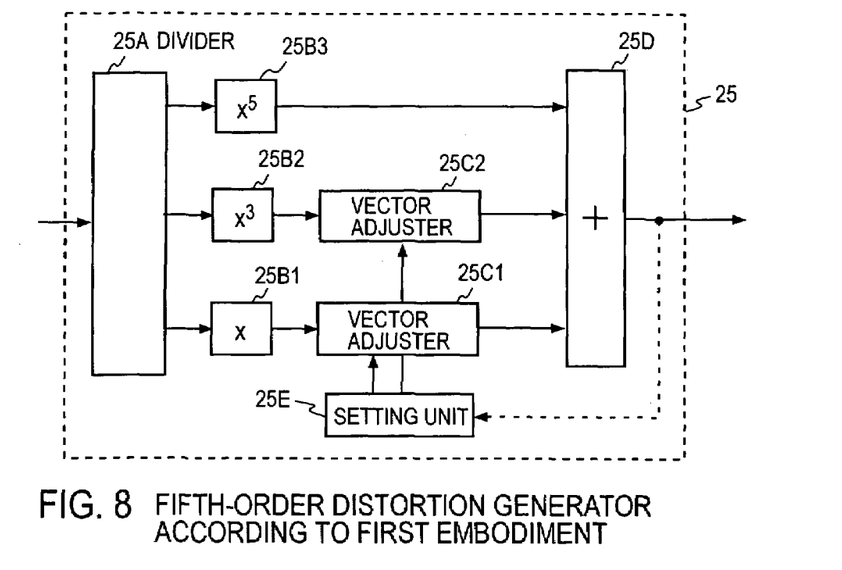
FIG. 8 shows a configuration of a fifth-order distortion generator according to the first embodiment.

FIG. 8 shows a configuration of the fifth-order distortion generator 25 shown in FIG. 6. The fifth-order distortion generator 25 carries out the calculation expressed by the equation (9) and has a configuration basically similar to that of the third-order distortion generator 23 shown in FIG. 7. In FIG. 8, the fifth-order distortion generator 25 comprises a divider 25A that divides the input signal into three paths, a fifth-order multiplier 25B3 that raises the divided signal to the fifth power, a third-order multiplier 25B2 that raises the divided signal to the third power, a vector adjuster 25C2 that adjusts the amplitude and phase of the output of the third-order multiplier 25B2, a first-order multiplier 25B1 that raises the divided signal to the first power, a vector adjuster 25C1 that adjusts the amplitude and phase of the output of the first-order multiplier 25B1, an adder 25D that sums up the output of the fifth-order multiplier 25B3 and the outputs of the vector adjusters 25C2 and 25C1, and a setting unit 25E that configures the vector adjusters 25C2 and 25C1 for appropriate adjustment.

As with the third-order distortion generator 23 described above, the first-order multiplier 25B1 is to pass the divided signal directly to the vector adjuster 25C1 and can be omitted. The output of the vector adjuster 25C1 corresponds to the term described below in the equation (9).

$$-b_{51}x(t) = -b_{51}A\cos(2\pi f_0 t) \tag{13}$$

The third-order multiplier 25B2 raises the divided input signal to the third power and produces a signal containing first-order and third-order components expressed by the term $$-b_{53}|x(t)|^2 x(t) = -b_{53}\left\{\frac{3}{4}A^3 \cos(2\pi f_0 t) + \frac{1}{4}A^3 \cos(3 \cdot 2\pi f_0 t)\right\} \tag{14}$$

in the equation (9). The fifth-order multiplier 25B3 raises the input signal to the fifth power and produces a signal containing first-order, third-order and fifth-order components shown in the second line of the equation (9).

The setting unit 25E determines the values $b_{51}$ and $b_{53}$ according to the equation (11). Then, the setting unit 25E sets the amplitude and phase of the vector adjuster 25C1 to the value $b_{51}$ in order to provide the signal expressed by the equation (13). The setting unit 25E sets the amplitude and phase of the vector adjuster 25C2 to the value $b_{53}$ to provide the signal expressed by the equation (14). Once the adder 25D sums up the outputs of the vector adjusters 25C1 and 25C2 and the output of the fifth-order multiplier 25B3, the equation (10) is satisfied. Thus, the first-order component and the third-order component in the equation (9) are made 0. Thus only the fifth-order distortion component is output from the adder 25D.

As described above, also in the fifth-order distortion generator 25, the fifth-order distortion component can be generated by eliminating the third-order component and the first-order component from the input signal raised to the fifth power. Therefore, the adjustment of the amplitude and phase of the output signal of the fifth-order distortion generator 25 by the vector adjuster 16 in the predistorter 20 shown in FIG. 6 has no effect on the amplitude and phase of the fundamental wave component and the third-order distortion component in the output signal r(t) of the adder 19. The fifth-order distortion generator 25 can be implemented by a digital signal processing.

Figure 9:
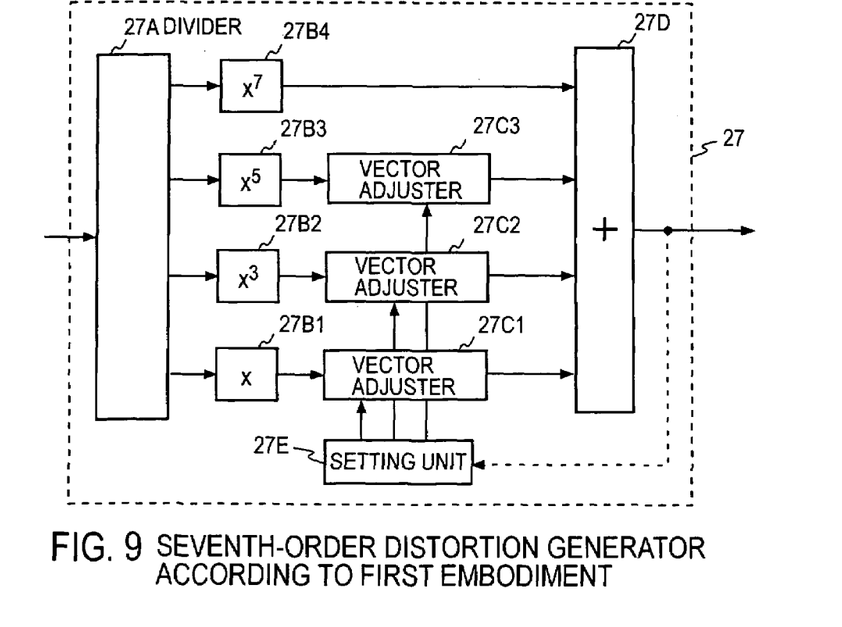
FIG. 9 shows a configuration of a seventh-order distortion generator according to the first embodiment.

FIG. 9 shows a configuration of the seventh-order distortion generator 27 in the predistorter 20 shown in FIG. 6. The seventh-order distortion generator 27 has a configuration basically similar to those of the third-order distortion generator 23 shown in FIG. 7 and the fifth-order distortion generator 25 shown in FIG. 8. Specifically, the seventh-order distortion generator 27 comprises a divider 27A that divides the input signal into four paths, a seventh-order multiplier 27B4 that raises the divided signal to the seventh power, a fifth-order multiplier 27B3 that raises the divided signal to the fifth power, a vector adjuster 27C3 that adjusts the amplitude and phase of the output of the fifth-order multiplier 27B3, a third-order multiplier 27B2 that raises the divided signal to the third power, a vector adjuster 27C2 that adjusts the amplitude and phase of the output of the third-order multiplier 27B2, a first-order multiplier 27B1 that raises the divided signal to the first power, a vector adjuster 27C1 that adjusts the amplitude and phase of the output of the first-order multiplier 27B1, an adder 27D that sums up the outputs of the seventh-order multiplier 27B4 and the vector adjusters 27C3, 27C2 and 27C1, and a setting unit 27E that controls the vector adjusters 27C3, 27C2 and 27C1. As with the other distortion generators described above, the first-order multiplier 27B1 only passes the divided signal directly to the vector adjuster 27C1.

The output signal of the seventh-order multiplier 27B4 contains the first-order signal component, the third-order signal component, the fifth-order signal component and the seventh-order signal component. The output signal of the seventh-order distortion generator 27 shown in FIG. 9 is produced by raising the input signal to the seventh power and eliminating the fifth-order, third-order and first-order signal components from the input signal raised to the seventh power. To this end, the setting unit 27E sets the amplitude and phase of the vector adjusters 27C1, 27C2 and 27C3 so as to exclude the first-order component, the third-order component and the fifth-order component from the output of the adder 27D. Thus, the output signal of the seventh-order distortion generator 27 ideally does not contain the fundamental wave component, which is a first-order component, the third-order distortion component and the fifth-order distortion component. Therefore, in the predistorter shown in FIG. 6, the vector adjuster 17 can adjust the phase and amplitude of the seventh-order distortion component without affecting the amplitude and phase of the fundamental wave component, the third-order distortion component and the fifth-order distortion component in the output of the adder 19. The seventh-order distortion generator 27 can be implemented by a digital signal processing.

In short, the predistorter shown in FIG. 6 that has the third-order, fifth-order and seventh-order distortion generators 23, 25 and 27 shown in FIGS. 7, 8 and 9, respectively, can separately control the phase and amplitude of each of the third-order, fifth-order and seventh-order distortion components by means of the vector adjusters 14, 16 and 17, respectively, without affecting the other distortion components. In addition, the third-order distortion generator 23 according to the first embodiment can be implemented by a digital signal processing.

In FIG. 6 showing the predistorter according to this embodiment, the third-order, fifth-order and seventh-order distortion generators 23, 25 and 27 are shown. However, depending on the characteristics of the power amplifier for which the distortion is to be removed (see FIG. 1), a distortion generator that generates a distortion of higher order may be needed, or one or two of the distortion generators may suffice. Furthermore, as shown as an example of the seventh-order distortion generator 27 in FIG. 9, for example, the first-order multiplier 27B1, the third-order multiplier 27B2 and the fifth-order multiplier 27B3 are preferably all provided. However, in general, it is essential only that the predistorter allows the power amplifier to meet the distortion characteristics requirement thereof, and thus, all of the fifth-order multiplier, the third-order multiplier and the first-order multiplier are not always needed.

In summary, it is essential only that a $(2k-1)$th-order distortion generator comprises at least a $(2k-1)$th-order multiplier that raises the divided signal to the $(2k-1)$th power, a $(2J-1)$th-order multiplier that raises the divided signal to the $(2J-1)$-th power (J denotes an integer falling within a range of $k > J \geq 1$), a vector adjuster that adjusts the amplitude and phase of the output of the $(2J-1)$th-order multiplier, and an adder that sums the output of the $(2k-1)$th-order multiplier and the output of the vector adjuster. However, as can be seen from the description with reference to FIG. 3D, since the first-order component in the output of the $(2k-1)$th-order distortion generator generally has a significant effect, a first-order multiplier (a through path) is preferably provided as the $(2J-1)$th-order multiplier.

The first embodiment has been described supposing that the input signal is composed of two carriers of equal amplitude. However, in the case where the input signal is a signal with a continuous spectrum, the setting unit 23E shown in FIG. 7 detects the first-order component in the output of the adder 23D and adjusts the vector adjuster 23C1 so as to reduce the level of the first-order component to a minimum. The setting unit 25E shown in FIG. 8 detects the first-order component and the third-order component in the output of the adder 25D and adjusts the vector adjusters 25C1 and 25C2 so as to reduce the levels of the first-order and third-order components to a minimum. The setting unit 27E shown in FIG. 9 detects the first-order component, the third-order component and the fifth-order component in the output of the adder 27D and adjusts the vector adjusters 27C1, 27C2 and 27C3 so as to reduce the levels of the first-order, third-order and fifth-order components to a minimum.

Furthermore, the predistorter according to the first embodiment can be implemented by a digital signal processing.

Second Embodiment

Figure 10:
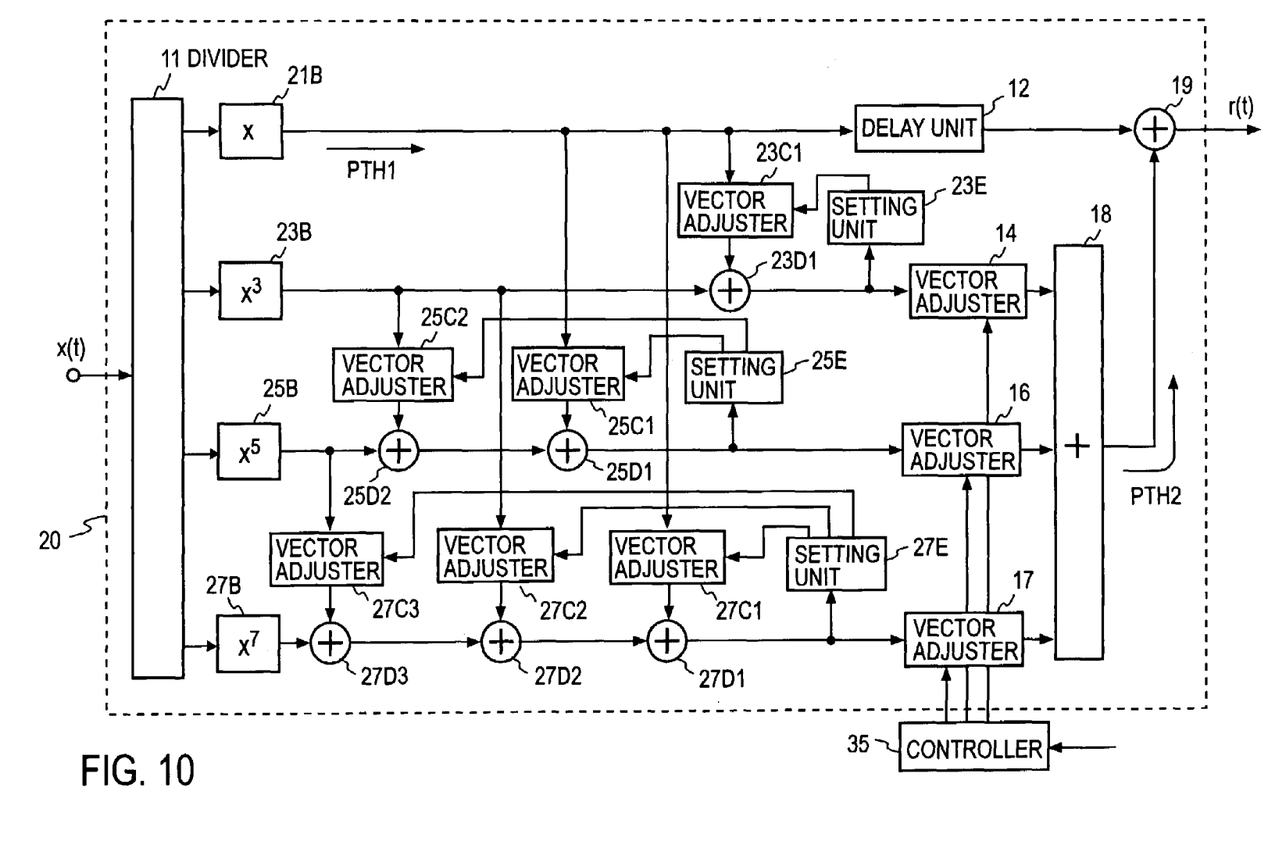
FIG. 10 shows a configuration of a predistorter according to a second embodiment of the present invention.

FIG. 10 shows a predistorter according to a second embodiment of the present invention. The predistorter according to the first embodiment described above and shown in FIG. 6 has a redundant configuration. The third-order distortion generator 23, the fifth-order distortion generator 25 and the seventh-order distortion generator 27 each have a third-order multiplier that carries out the same calculation. The fifth-order distortion generator 25 and the seventh-order distortion generator 27 each have a fifth-order multiplier that carries out the same calculation. However, according to the second embodiment, a vector adjuster and an adder are provided that vector-adjusts the output of each of the lower-than-ith-order multipliers and adds its output to the output of each ith-order multiplier ($i=2k-1$), that is, each of the $(2j-1)$th-order multipliers ($k > j$; $j=1, 2, \ldots$) are added to the output of the ith-order multiplier after adjusting the vector of the output of each of the $(2j-1)$th-order multipliers. Thus, when the predistorter generates up to ith ($i=2k-1$ and $k=1, 2, \ldots, K$) distortion components, the predistorter has one ith-order multiplier ($i=2k-1$ and $k=1, 2, \ldots, K$), in other words, K multipliers in total. That is, the distortion generator according to the second embodiment is a combination of the third-order distortion generator 23, the fifth-order distortion generator 25 and the seventh-order distortion generator 27 according to the first embodiment. While the distortion generators of seventh and lower orders are illustrated in the second embodiment, the predistorter may include a distortion generator of higher than seventh order.

Specifically, for the output of a seventh-order multiplier 27B, there are a vector adjuster 27C3 and an adder 27D3 that adds the output of a fifth-order multiplier 25B to the output of the seventh-order multiplier 27B after adjusting the vector of the output of the fifth-order multiplier 25B, a vector adjuster 27C2 and an adder 27D2 that adds the output of a third-order multiplier 23B to the output of the seventh-order multiplier 27B after adjusting the vector of the output of the third-order multiplier 23B, and a vector adjuster 27C1 and an adder 27D1 that adds the output of a first-order multiplier 21B to the output of the seventh-order multiplier 27B after adjusting the vector of the output of the first-order multiplier 21B. Furthermore, for the output of the fifth-order multiplier 25B, there are a vector adjuster 25C2 and an adder 25D2 that adds the output of the third-order multiplier 23B to the output of the fifth-order multiplier 25B after adjusting the vector of the output of the third-order multiplier 23B, and a vector adjuster 25C1 and an adder 25D1 that adds the output of the first-order multiplier 21B to the output of the fifth-order multiplier 25B after adjusting the vector of the output of the first-order multiplier 21B. Furthermore, for the output of the third-order multiplier 23B, there are a vector adjuster 23C1 and an adder 23D1 that adds the output of the first-order multiplier 21B to the output of the third-order multiplier 23B after adjusting the vector of the output of the first-order multiplier 21B. In addition, there are a setting unit 27E that controls the vector adjusters 27C1, 27C2 an 27C3, a setting unit 25E that controls the vector adjusters 25C1 and 25C2, and a setting unit 23E that controls the vector adjuster 23C1.

The output of the first-order multiplier 21B is passed to an adder 19 via a delay unit 12. The output of the third-order multiplier 23B is passed to an adder 18 via the adder 23D1 and a vector adjuster 14. The output of the fifth-order multiplier 25B is passed to the adder 18 via the adders 25D2 and 25D1 and a vector adjuster 16. The output of the seventh-order multiplier 27B is passed to the adder 18 via the adders 27D3, 27D2 and 27D1 and a vector adjuster 17. The sum result of the adder 18 is passed to the adder 19 as the output of a distortion generating path PTH2, and the adder 19 sums the output of the distortion generating path PTH2 and the output of a linear transmission path PTH1 and outputs the sum result in the form of a signal r(t) predistorted by the predistorter 20.

The combination of a distributor 11, the first-order multiplier 21B, the third-order multiplier 23B, the fifth-order multiplier 25B, the seventh-order multiplier 27B, the vector adjusters 27C1, 27C2 and 27C3, the adders 27D1, 27D2 and 27D3 and the setting unit 27E corresponds to the seventh-order distortion generator 27 shown in FIG. 9. The combination of the distributor 11, the first-order multiplier 21B, the third-order multiplier 23B, the fifth-order multiplier 25B, the vector adjusters 25C1 and 25C2, the adders 25D1 and 25D2 and the setting unit 25E corresponds to the fifth-order distortion generator 25 shown in FIG. 8. The combination of the distributor 11, the first-order multiplier 21B, the third-order multiplier 23B, the vector adjuster 23C1, the adder 23D1 and the setting unit 23E corresponds to the third-order distortion generator 23 shown in FIG. 7. The principles based on which these combinations generate the seventh-order distortion, the fifth-order distortion and the third order distortion are the same as those shown in FIGS. 9, 8 and 7, respectively. Thus, operations of the combinations will not be further described.

The predistorter according to the second embodiment can be implemented by a digital signal processing.

Figure 11:
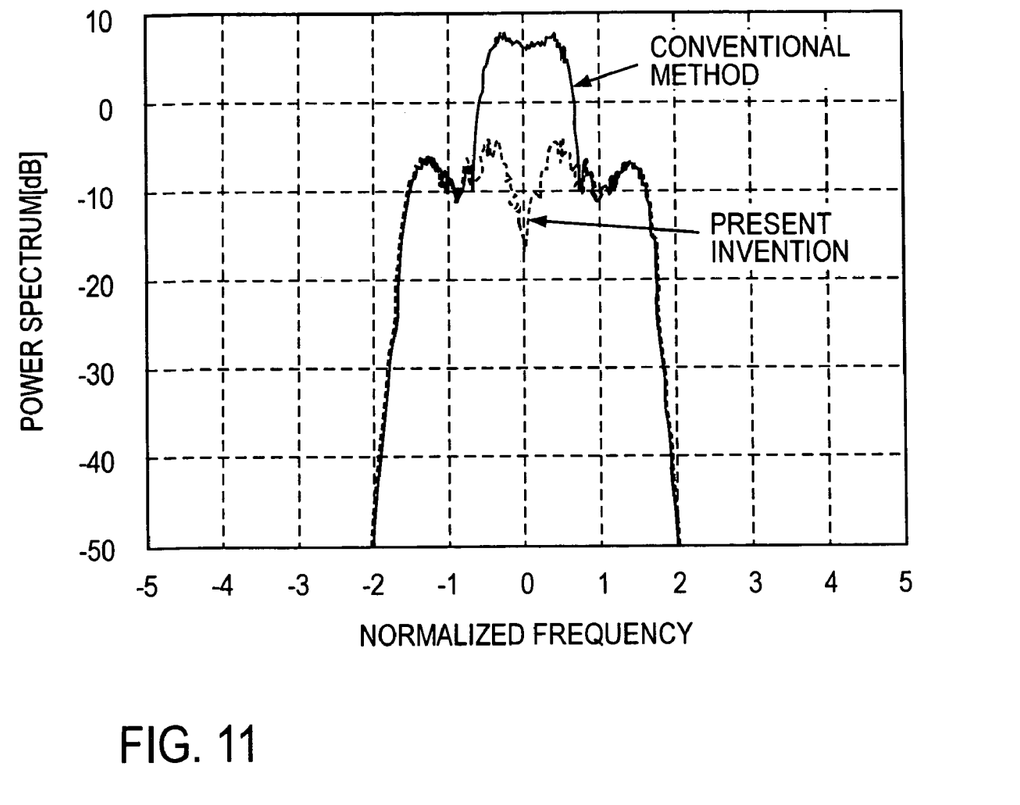
FIG. 11 shows spectra of output signals of a third-order distortion generator according to a conventional method and the third-order distortion generator according to the present invention.

FIG. 11 shows a spectrum of the output signal of the third-order distortion generator in the case where a signal with continuous spectrum is input to the predistorter according to the first or second embodiment. The horizontal axis indicates the normalized frequency, and the vertical axis indicates the power. FIG. 11 shows an output signal of a conventional third-order distortion generator as well as the output signal of the third-order distortion generator according to the present invention. The spectrum of the output signal of the conventional third-order distortion generator exhibits a first-order component around a normalized frequency of 0. To the contrary, the first-order component, which corresponds to a transmission signal, is removed from the spectrum of the output signal of the third-order distortion generator according to the first or second embodiment. Similarly, for the fifth-order and seventh-order distortion generators according to the present invention, the components of orders lower than their respective orders can be reduced.

The present invention can be applied to a power amplifier for a radio communication transmitter.

What is claimed is:

1. A predistorter, comprising:
   a divider that divides an input signal and supplies the divided input signals to a linear transmission path and a distortion generating path;
   a (2k−1)th-order distortion generator that raises the divided input signal supplied to said distortion generating path to the (2k−1)th power to generate a distortion component, where k denotes an integer equal to or greater than 2;
   a first vector adjusting means that adjusts the amplitude and phase of an output signal of said (2k−1)th-order distortion generator; and
   addition means that sums up an output signal of said first vector adjusting means and an output signal of said linear transmission path and outputs the predistorted input signal,
   wherein said (2k−1)th-order distortion generator comprises:
      a (2k−1)th-order multiplier that raises the divided input signal supplied to said distortion generating path to the (2k−1)th power;
      a (2J−1)th-order multiplier that raises said divided input signal to the (2J−1)th power, where J denotes an integer falling within a range of k>J≧1;
   a first vector adjuster that adjusts the amplitude and phase of an output of said (2J−1)th-order multiplier; and
   a first adder that sums up the output of said first vector adjuster and an output of said (2k−1)th-order multiplier and outputs the sum result as an output of said (2k−1)th-order distortion generator, and
   said first vector adjuster is configured to perform the amplitude and phase adjustments of the output of said (2J−1)th-order multiplier so as to suppress a lower-than-(2k−1)th-order component produced by said (2k−1)th-order multiplier in the output of said first adder.

2. The predistorter according to claim 1, wherein k is equal to or greater than 3 and J is equal to or greater than 2 and said (2k−1)th-order distortion generator further comprises:
   a (2h−1)th-order multiplier that raises said divided input signal to the (2h- 1)th power, where h denotes an integer falling within a range of J>h≧1; and
   a second vector adjuster that adjusts the amplitude and phase of the output of said (2h−1)th-order multiplier and passes the resulting output to said first adder, and
   said second vector adjuster is configured to perform the amplitude and phase adjustments so as to suppress said lower-than-(2k−1)th-order component in the output of said first adder.

3. The predistorter according to claim 1, wherein a setting unit is provided that controls said first vector adjuster in said (2k−1)th-order distortion generator based on the output of said first adder.

4. The predistorter according to claim 2, wherein a setting unit is provided that controls said first and second vector adjusters in said (2k−1)th-order distortion generator based on (2J−1)th and (2h−1)th-order components in the output of said first adder.

5. The predistorter according to any one of claim 1, 2, 3 or 4, further comprising:
- a (2k'−1)th-order distortion generator that raises said divided input signal to the (2k'−1)th power to generate a distortion component;
- a second vector adjusting means for adjusting amplitude and phase of the output of the (2k'−1)th-order distortion generator and adding the adjusted output to the output of said linear transmission path, where k' is an integer greater than k, wherein said (2k'−1)th-order distortion generator comprises:
- a (2k'−1)th-order multiplier that raises the input signal supplied to said distortion generating path to the (2k'−1)th power;
- a (2J'−1)th-order multiplier that raises said divided input signal to the (2J'−1)th power, where J' denotes an integer falling within a range of k'>J'≧1;
- a third vector adjuster that adjusts the amplitude and phase of the output of said (2J'−1)th-order multiplier; and
- a second adder that sums up the output of said third vector adjuster and the output of said (2k'−1)th-order multiplier and outputs the sum result as an output of said (2k'−1)th-order distortion generator, and said third vector adjuster is configured to perform the amplitude and phase adjustments based on the output of said second adder so as to reduce a lower-than-(2k'−1)th-order component produced by said (2k'−1)th-order multiplier in the output of said second adder.

6. A predistortion method, comprising:
- a step of dividing an input signal and supplying the divided input signals to a linear transmission path and a distortion generating path;
- a step of generating a distortion component, using a processor, by raising the divided input signal supplied to said distortion generating path to the (2k−1)th power, where k denotes an integer equal to or greater than 2; and
- a step of adjusting the amplitude and phase of said distortion component and adding the adjusted distortion component to an output signal of said linear transmission path, thereby predistorting the input signal, wherein said step of generating a distortion component further comprises:
- (a) a sub-step of raising the divided input signal supplied to said distortion generating path to the (2k−1)th power;
- (b) a sub-step of raising said divided input signal to the (2J−1)th power, where J denotes an integer falling within a range of k>J≧1;
- (c) a sub-step of adjusting the phase and amplitude of the result of said raising to the (2J−1)th power; and
- (d) adding the adjusted result to the result of said raising to the (2k−1)th power to suppress a lower-than-(2k−1)th-order component in the result of said raising, to thereby generate said distortion component.

* * * * *